US00RE36615E

United States Patent [19]

Wood

[11] E Patent Number: Re. 36,615

[45] **Reissued Date of Patent: *Mar. 14, 2000**

[54] USE OF VANADIUM OXIDE IN MICROBOLOMETER SENSORS

[75] Inventor: R. Andrew Wood, Bloomington, Minn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/920,367

[22] Filed: Aug. 29, 1997

Related U.S. Patent Documents

Reissue of:

[64] Patent No.: 5,450,053
Issued: Sep. 12, 1995
Appl. No.: 08/085,243
Filed: Jun. 29, 1993

U.S. Applications:

[63] Continuation of application No. 07/035,118, Mar. 11, 1987, abandoned, which is a continuation-in-part of application No. 06/781,557, Sep. 30, 1985, Pat. No. 4,654,622.

[51] Int. Cl.[7] ..... H01L 31/08; H01C 7/00; G02B 26/10

[52] U.S. Cl. ..... 338/18; 250/370.14; 250/334; 250/250; 338/14; 338/22 R; 343/700 MS

[58] Field of Search ..... 338/18, 14, 22 R; 250/370.14, 334, 250; 343/700 MS

[56] References Cited

U.S. PATENT DOCUMENTS

| | | | |
|---|---|---|---|
| 3,484,611 | 12/1969 | Futaki . | |
| 3,619,614 | 11/1971 | Yamaka . | |
| 3,629,585 | 12/1971 | Desvignes et al. . | |
| 3,693,011 | 9/1972 | DeVaux et al. . | |
| 3,801,949 | 4/1974 | Larrabee | 338/22 R |
| 3,851,174 | 11/1974 | Tynan et al. . | |
| 3,896,309 | 7/1975 | Halsor et al. | 250/370.14 |
| 4,009,516 | 3/1977 | Chiang et al. . | |

(List continued on next page.)

FOREIGN PATENT DOCUMENTS

| | | |
|---|---|---|
| 2253214 | 5/1974 | Germany . |
| 58-131525 | 8/1983 | Japan . |
| 60-119426 | 6/1985 | Japan . |
| 61-170626 | 8/1986 | Japan . |
| 61-195318 | 8/1986 | Japan . |
| 1-136035 | 5/1989 | Japan . |
| 3-41305 | 2/1991 | Japan . |
| 91/16607 | 8/1986 | WIPO . |

OTHER PUBLICATIONS

E. Bassous, Fabrication of Novel Three Dimensional Microstructures by the Anisotropic Etching of(100) and (110) Silicon, 10 IEEE Transactions on Electron Devices, 1178–1185, 1978 (FF).

Kurt E. Peterson, Dynamic Micromechanics on Silicon: Techniques and Devices, 10, IEEE Transactions on Electron Devices, 1241–1250, 1978.

Kurt Peterson & Anne Shartel, Micromechanical Accelerometer Integrated with MOS Detection Circuitry, IBM Research Facility, 1980.

H. Elabd & W.F. Kosonocky, Theory and Measurements of Photoresponse for Thin Film $Pd_2Si$ and PtSi Infrared Schottky–Barrier Detectors with Optical Cavity, 43 RCA Review, 569–588, 1982.

K.C. Liddiard, Thin Film Resistance Bolometer IR Detectors, Infrared Phys., vol. 24, No. 1, 57–64, 1984.

(List continued on next page.)

*Primary Examiner*—Stephen C. Buczinski
*Attorney, Agent, or Firm*—Ian D. MacKinnon; John G. Shudy, Jr.; Roger W. Jensen

[57] ABSTRACT

In a microbolometer infrared radiation sensor, a detector material ($VO_2$) having a high thermal coefficient of resistance to increase the sensitivity of the apparatus.

35 Claims, 4 Drawing Sheets

U.S. PATENT DOCUMENTS

| | | | |
|---|---|---|---|
| 4,029,962 | 6/1977 | Chapman . | |
| 4,067,104 | 1/1978 | Tracy . | |
| 4,115,692 | 9/1978 | Belcerak et al. . | |
| 4,169,273 | 9/1979 | Hendrickson . | |
| 4,239,312 | 12/1980 | Myer et al. . | |
| 4,286,278 | 8/1981 | Lorenze et al. . | |
| 4,317,126 | 2/1982 | Gragg . | |
| 4,354,109 | 10/1982 | Gelpey et al. . | |
| 4,365,106 | 12/1982 | Pulvari . | |
| 4,378,489 | 3/1983 | Chabinsky et al. . | |
| 4,463,493 | 8/1984 | Momose . | |
| 4,472,239 | 9/1984 | Johnson et al. | 156/648 |
| 4,654,622 | 3/1987 | Foss et al. | 338/14 |
| 4,691,104 | 9/1987 | Murata et al. . | |
| 4,750,834 | 6/1988 | Fateley | 356/346 |
| 4,803,360 | 2/1989 | Ball et al. . | |
| 5,017,784 | 5/1991 | Sher et al. . | |
| 5,455,421 | 10/1995 | Spears . | |

OTHER PUBLICATIONS

M. Okuyama, et al., Si–Monolithic Integrated Pyroelectric Infrared Sensor Using $PbTiO_3$Thin Film, 6. International Journal of Infrared and Millimeter Waves, 71–78, 1985.

W.F. Kosonosky, et al., 160 ×244 Element PtSi Schottky–Barrier IR–CCD Image Sensor, vol. Ed–32, No. 8, IEEE Transactions on Electron Devices, 1564–1573, Aug., 1985.

K.C. Liddiard, Thin–Film Resistance Bolometer IR Detectors—II, Infrared Phys., vol. 26, No. 1, 43–49, 1986.

Suzuki, et al, An Infrared Detector Using Poly–Silicon p–n Junction Diode, Tech Digest of 9th Sensor Symposium, 71–74, 1990.

A. Tanaka, et al., Infrared Linear Image Sensor using a Poly–Si pn Junction Diode Array, 33 Infrared Phys., 229–236, 1992.

DETAIL OF HIGH THERMAL
ISOLATION MICROSENSOR

USE OF VANADIUM OXIDE IN MICROBOLOMETER SENSORS

Matter enclosed in heavy brackets [ ] appears in the original patent but forms no part of this reissue specification; matter printed in italics indicates the additions made by reissue.

This application is a continuation, of application Ser. No. 07/035,118, filed Mar. 11, 1987, now abandoned, which is a continuation in part of Ser. No. 781,557 filed 30 Sep. 1985, now U.S. Pat. No. 4,654,622.

The U.S. Government has certain rights in this invention pursuant to the terms of a contract DAAL01-85-C-0153.

BACKGROUND AND SUMMARY OF THE INVENTION

This invention is directed to the field of microbolometer infrared radiation sensors. Particularly described herein is the use of a new detector material ($AB_x$) in the microbolometer sensor.

A monolithic integrated focal plane sensitive to both mm-waves (typically 94 GHz) and (typically 3–5 and 8–12 micron) IR radiation is constructed on a silicon wafer by selective anisotropic etching to fabricate microbolometer radiation sensors in a linear or two-dimensional array. Sensors intended for IR detection are coated with an IR absorbing material. Those intended for mm-wave sensing are connected to metal film antennas deposited on the surface of the silicon wafer. In this structure there is combined known silicon IC processing techniques with a rugged high-g-load-tolerant structure that permits the thermal conduction losses to approach the radiative losses of the element. Of particular importance is the combining and interspersing of millimeter wave sensors with high performance infrared sensors and electronics on the same silicon chip, and fabricating in the same processing steps.

The fabrication of novel three-dimensional microelectronic devices in a semiconductor crystal, typically silicon has been accomplished by fabricating the device through many techniques including isotropic and anisotropic etching. These techniques utilize the cystalline structure of a single crystal semiconductor. An example is the Johnson et al patent 4,472,239, "Method of Making Semiconductor Device", assigned to the same assignee as the present invention. The referenced patent shows that the technique is known to manufacture micromechanical devices by etching into single crystal silicon. The citation of this patent is provided merely as background and is not deemed as prior art to the specific invention claimed in this application.

In the prior art, such as patent 3,801,949, there has been taught an infrared sensitive solid-state imaging device which is small in size and which has a two-dimensional array of IR detector elements in an integrated microcircuit. The detector array is fabricated on a single crystal silicon substrate coated with a thin layer of electrical insulating material, such as silicon dioxide or silicon nitride. Etched openings are made in the silicon beneath the insulating layer wherever a sensing element is desired for the purpose of thermally isolating the sensing elements from their surroundings. In the present invention an integrated dual-mode IR/millimeter-wave sensor array is taught. The section of the magnetic spectrum including millimeter waves and 3–5 or 8–12 micron infrared radiation is shown in FIG. 1. The mm-waves of about 94 GHz and the 3–12 micron IR are several orders of magnitude apart in frequency and devices for sensing or detecting these two categories differ substantially. It is desired to fabricate a monolithic integrated two-dimensional focal plane array which has array elements sensitive to 3–5 and/or 8–12 micron IR and elements sensitive to mm-waves. The elements incorporate $VO_2$. The individual integrated sensors are about 0.1 mm in size and do not effectively couple the energy from the mm-waves which are of a greater wavelength. It has been discovered that when the integrated sensor elements intended for mm-wave detection are provided with antennas (such as full wave dipoles or bow-tie type) a successful mm-wave energy coupling apparatus is achieved.

DESCRIPTION

Figure 1:
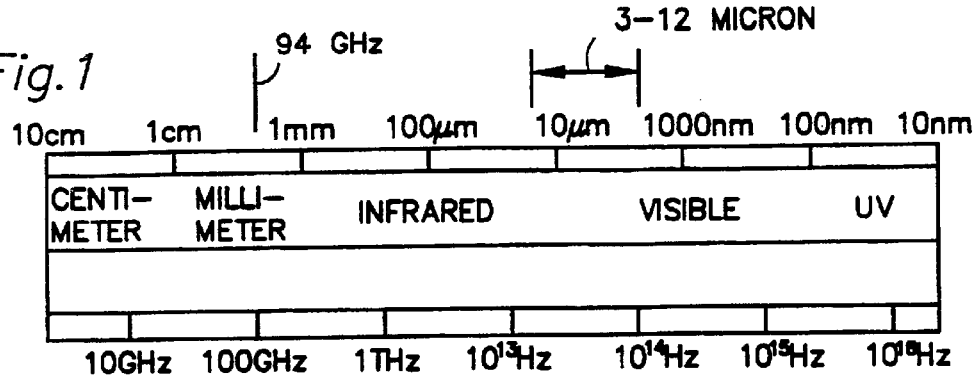
FIG. 1 shows a pertinent section of the electromagnetic spectrum.
Figure 2A:
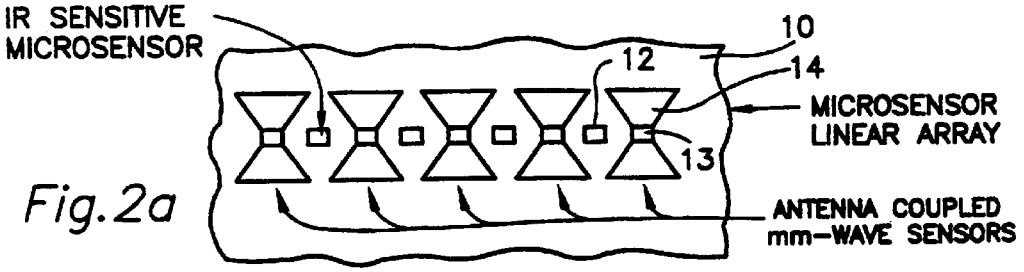
FIG. 2a is one embodiment of a microsensor linear array.
Figure 2B:
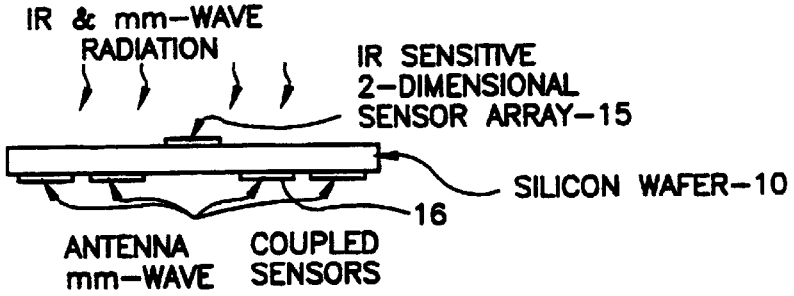
FIG. 2b discloses in two-dimensional geometry one embodiment of an integrated dual-mode IR sensors and mm-wave sensors.

Referring now to FIG. 2a there is shown a linear geometry version of a monolithic integrated dual mode IR/mm-wave microsensor linear array. Two-dimensional arrays mayb be obtained by constructing several adjacent linear arrays. A focal plane sensitive to both IR radiation (3–5 and/or 8–12 micron) and mm-waves is constructed on a semiconductor substrate wafer 10, such as monocrystalline silicon. The microsensors 12 intended for IR sensing are coated with an IR absorbing material such as a thin metal film. The microsensors 13 intended for mm-wave sensing are connected to metal film antennas 14 deposited on the surface of the silicon wafer. A two-dimensional geometry version is shown in FIG. 2b in which IR sensitive microsensor arrays 15 are formed on one surface of the silicon wafer 10 and antennas 16 are formed on the other surface of the wafer. This embodiment will be described later.

Figure 3:
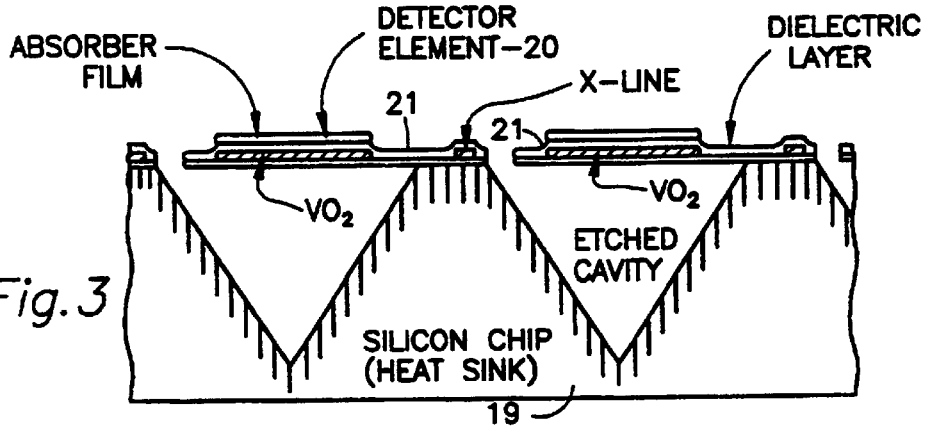
FIG. 3 shows a cross section of a microsensor structure.

In FIG. 3 there is shown a cross section of a microsensor structure showing the thermal isolation configuration as taught in patent 4,472,239, above referenced. The microsensor imaging array is on a silicon chip 19, based upon anisotropic silicon etching in which a small mass, thin film radiation detector 20 is fabricated into a thermally isolated dielectric cantilever structure 21 on the surface of the silicon chip. The small mass and thermal isolation provide arrays with excellent detector sensitivity and response time. The millimeter-wave array uses planar dipole or bow-tie type antennas to couple the mm-wave radiation to the thermally integrating microsensors.

Figure 4:
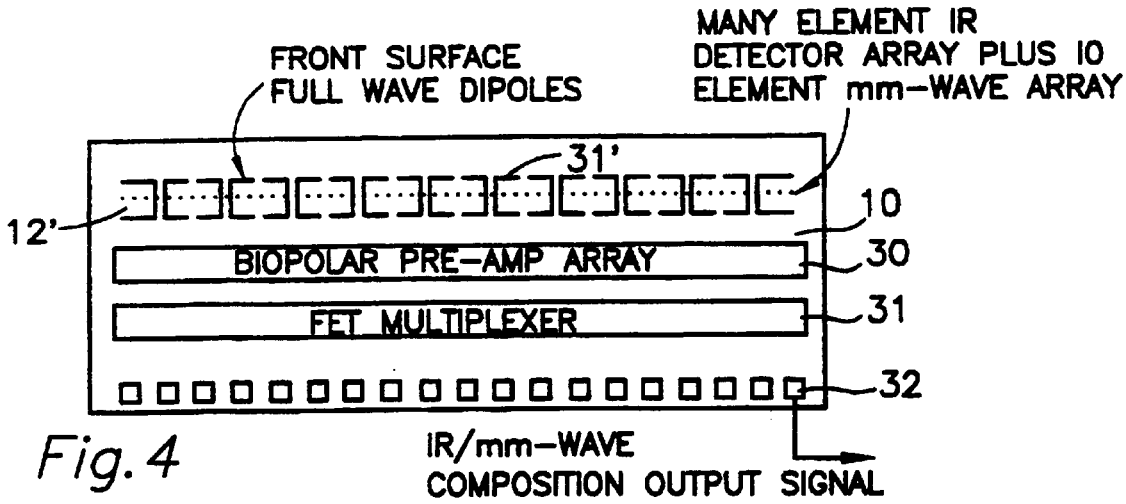
FIG. 4 shows the front surface detail of full-wave dipole antenna integrated IR/mm-wave array.
Figure 5A:
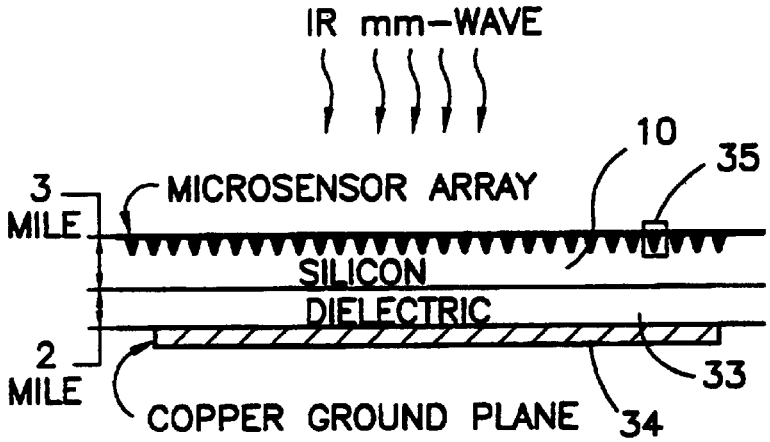
FIGS. 5a and 5b show detail of high thermal isolation microsensor.
Figure 5B:
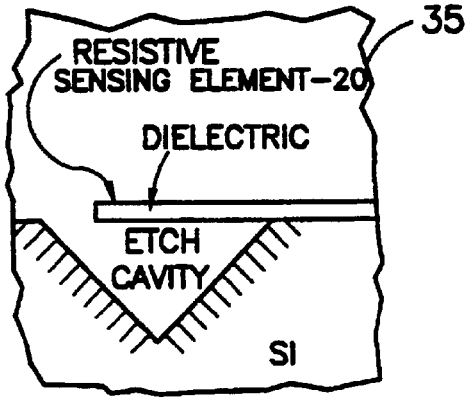

In FIG. 4 there is shown a detail of the front surface of a full-wave dipole antenna type integrated infrared/millimeter wave sensor electronically scanned linear array. Interspersed with the multielement (ex.=300) IR detector elements 12' are a plurality (ex.=10) of antenna coupled mm-wave elements 13'. Also shown in block form is a bipolar pre-amp array 30 and an FET multiplexer 31. An IR/mm-wave output signal is detected at 32. A partial cross section of FIG. 4 cut through the detector array is shown in FIG. 5a. The silicon wafer 10 also includes a dielectric layer 33 and a copper ground plane 34. A detail of one of the high thermal isolation microsensors 35 is shown in the balloon of FIG. 5b in which a resistor sensor 20 carrying dielectric cantilever 21 is thermally isolated by the etch cavity in the silicon.

A structure which is required to couple efficiently to a mm-wave radiation field must necessarily have dimensions of the order of about the wavelength, e.g. 3 millimeters at 94 GHz). In the case of an uncooled sensor, a sensitive area this large would lead to degraded responsivity or response speed due to the increased thermal mass of the sensor. We therefore require dimension of a few mils, and must therefore couple the sensor to the radiation field via an antenna structure with dimensions of the order of the wavelength. Since microsensor arrays can be conveniently fabricated on silicon substrates by photolithographic processes, we desire the antenna and any coupling waveguides to be planar in design.

Figure 6:
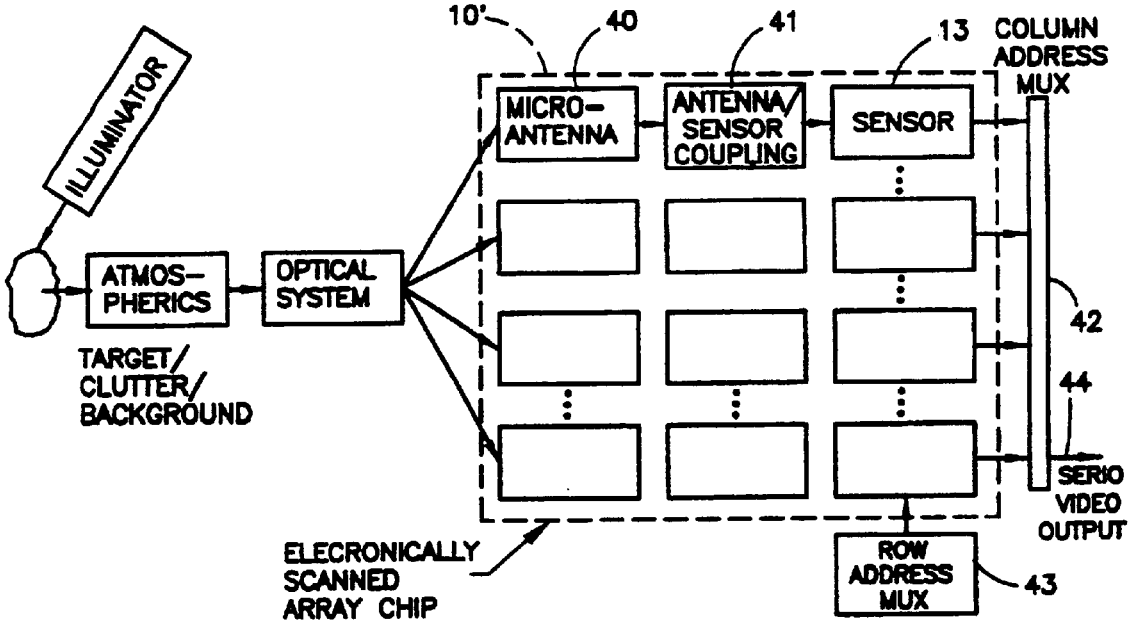
FIG. 6 shows the overall scanned array functional diagram.
Figure 7:
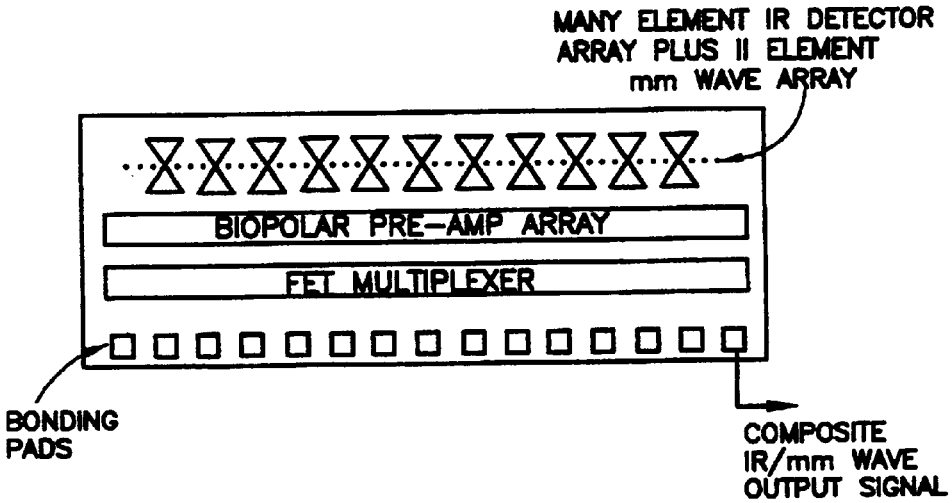
FIGS. 7 and 8 show the dual mode sensor design using bow-tie microantenna design.

The mm-wave array portion, such as shown in FIGS. 2a and 4, is further shown in FIG. 6 and consists of a silicon substrate 10', upon which we use photolithography to fabricate an array of planar microantennas 40, coupling waveguides 41 and microsensors 13, with electrical leadouts to an electronic readout circuit as shown in FIG. 6. MM-wave radiation is collected by the microantennas 40, and coupled 41 to the dissipative load of the microsensors 13, whose temperatures will rise causing the resistance to change. A low-noise electronic circuit including a column address mux.42 and a row address mux.43 monitors the resistances of the microsensor elements and provides electrical signals 44 to output circuitry dependent on the application such as target detection and recognition.

The microsensor consists of a low-mass sensor element 20 which is almost completely thermally isolated from its supporting structure as shown earlier in FIG. 3. A resistance element is fabricated on the sensor using a material whose resistance changes with temperature. Any electrical power dissipated in this sensor resistance (e.g. by direct infrared radiation on the sensor or by mm-wave radiation coupled in from an antenna) heats the sensor element 20 by an amount inversely proportional to the sensor thermal mass and thermal conductance to the supporting structure. The sensitivity of the microsensor requires a low thermal mass sensor and good thermal isolation. The dissipated heat will flow to the supporting structure with a time constant given by the sensor thermal capacity times the thermal resistance to the surroundings. This response time can be arranged to be milliseconds without sacrificing sensitivity; faster response times can be achieved by trading off sensitivity. The thin film resistance element has contacts adapted to be connected to an output circuit. The electrical output signals are obtained by the use of a readout circuit which is sensitive to resistance changes in the microsensor resistance.

The ultimate signal to noise ratio of such a microsensor is achieved by the use of a very small sensor thermal mass, and very high thermal isolation from the supporting structure. The minimum noise level possible is due to Johnson noise in the sensor load resistance, preamplifier noise and to fluctuations in the radiative and conductive power interchanged between the sensor and its surroundings. In the case of mm-wave radiation coupled electrically into a microsensor from a microantenna, the sensor may be coated with a highly reflective material so that radiation interchange noise can be reduced to a low level. In this case the noise limits would be due to a) Johnson noise, b) amplifier noise and c) thermal conduction noise.

Of particular importance is the very low conduction noise which is achieved by the excellent thermal isolation and low mass of the proposed structure. Using typical parameter values demonstrated by the prototype devices, we calculate that noise equivalent power levels of $6\times10^{-12}$ watts/$\sqrt{Hz}$ are expected, assuming 75% coupling efficiency to the radiative mm-wave field. This calculated figure is in close agreement with experimental data obtained on prototype devices.

Experimental Results

Prototype devices have been connected to an electronic readout circuit designed to display small resistance changes on an oscilloscope. The sensors were installed in a metal chamber that could be evacuated to vary the sensor thermal leak. Windows of ZnS and glass were available to admit IR and mm-wave radiation into the sensor chamber. A 10 Hz chopper was mounted in front of the sensor window. A 1000° K. black body IR source was used to calibrate the sensor with an IR intensity of $7\times10^{-4}$ W/cm$^2$. A sensor response of about 100 mV was observed with the sensor at atmospheric pressure, and about 400 mV with the sensor cell evacuated. A 3.2 mm (94 GHz) CW oscillator source was used to illuminate the sensor with a mm-wave intensity of about $2\times10^{-3}$ w/cm$^2$ at the sensor. The observed signal amplitude from the sensor was measured at 280 mV. The mm-wave signals increased in amplitude by about a factor of four as the cell pressure was reduced from 760 to 0.5 torr, indicating that the signal was due to the normal microsensor thermal response mechanism.

Microantenna Considerations

The properties of planar antennas lying on dielectric (e.g. Si, $Si_3N_4$, $SiO_2$) surfaces are quite different from antennas in homogeneous media. The principal differences are 1) the polar diagram is always heavily biased towards the dielectric, so that efficient collection of radiation is biased towards radiation incident from the dielectric side, and 2) additional peaks in the polar diagram may occur: some peaks are found along the substrate surface plane, indicating coupling to substrate surface waves which will lead to cross-talk between adjacent antennas on that surface. Although the polar diagram of a planar antenna on a dielectric substrate is heavily biased towards the dielectric, this bias can be reversed by depositing a metallic ground plane (e.g. 2000° A. copper) on the back surface of the silicon substrate as shown in FIG. 5a, so that all radiation is reflected towards the air side, and the antenna only "looks" towards the air. This arrangement is very desirable, since IR sensors receive radiation from the airside, and common reflective optics can then be used for an array of mm-wave and IR-sensors fabricated on the same silicon wafer.

Figure 8:
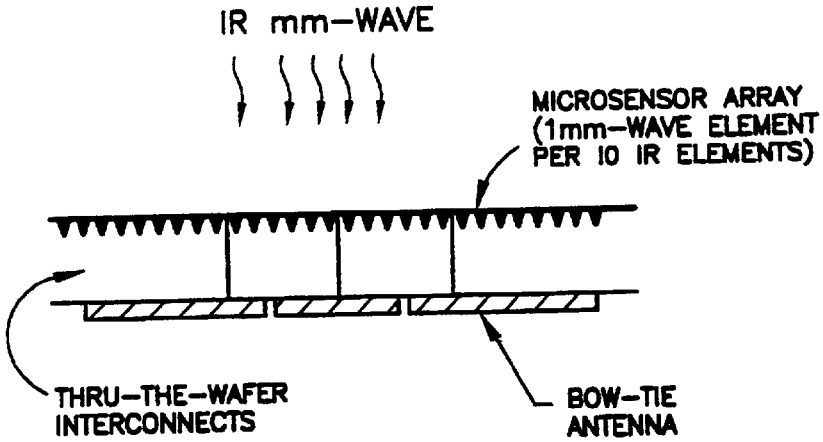
Figure 9:
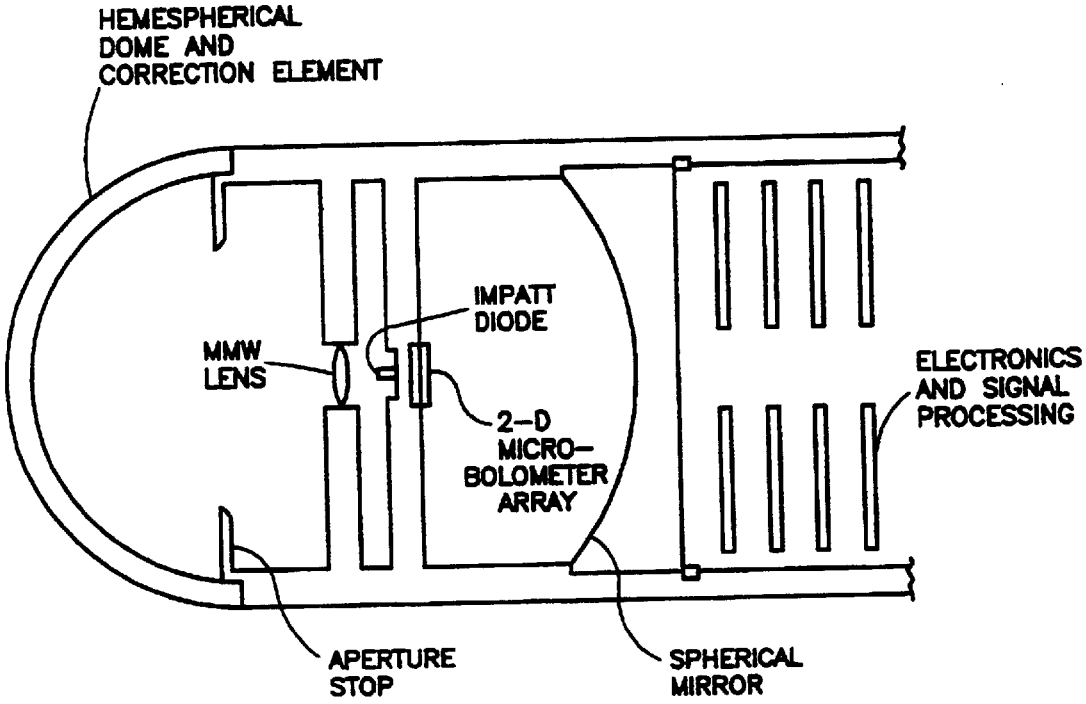
FIG. 9 shows one embodiment of a dual-mode system illustrated schematically in FIG. 6.

An alternate modification alluded to earlier is the use of "bow-tie" antenna designs where the incident radiation is through the dielectric substrate. Our tests have shown that bow-tie antennas can be used in linear arrays to efficiently collect mm-wave radiation incident through the substrate. In this configuration the IR radiation is absorbed in the front side detector elements while the mm-wave radiation passes through the silicon wafer and is collected by the backside bow-tie antennas (FIG. 8). In this approach through-the-wafer interconnects from antenna to sensor are preferably used. This alternate approach offers good performance, with

- Simple, planar geometry fabricated from metal films deposited on Si wafer surfaces.
- A polar diagram heavily biased (by a factor $n^3$), where n is the refractive index, into the dielectric, with beam width tailorable by adjustment of the bow-tie angle as shown in FIG. 8.

A resistive characteristic impedance, tailorable by adjustment of the bow-tie angle, constant over wide frequency range.

Coupling of Antenna to Microsensors

The simplest way of coupling a dipole antenna to a radiation sensor is to fabricate the sensor between the arms of the dipole and metallize the antenna to the sensor load. The antenna impedance can be matched to sensor loads in the 100 ohm range.

A High Sensitivity Detector Material

Referring again to FIG. 3 which shows a cross section of a microsensor structure there is shown a detector element 20. The requirements of a high sensitivity material for microbolometer sensor detectors are a) high thermal coefficient of resistance (TCR)

b) low 1/f noise c) deposited in a thin film (<1000 angstroms)

d) process compatible with microbolometer fabrication technology e) no anomalous thermal capacity f) film impedance compatible with microbolometer readout circuitry (100 to 100,000 ohms).

Vanadium oxides (preferably $VO_2$) satisfy all these requirements. Vanadium oxides have very strong changes in resistance with temperature, allowing high sensitivity microbolometer operation. The TCR is typically −0.01 to −0.04 per degree Centigrade, and much higher at the semiconductor-to-metal transition. This typical range is much higher than the TCR for the detector material permalloy (previously used) which is approximately 0.0035 per degree Centigrade. The 1/f noise can be kept low by the use of high conductivity $VO_2$, that is, about 1000 ohms/square in 1000 angstrom films. The $VO_2$ thin film detector 20 can be deposited directly onto the dielectric layer 21 with a chosen film impedance. This deposition is preferably by the process of ion beam sputter which permits the deposition of very thin layers using growth conditions compatible with the silicon microbridge technology. In the preferred embodiment at this time the $VO_2$ is operated in its semiconductor phase. An increased thermal capacity occurs at the semiconductor-to-metal phase transition, but is acceptably low.

The embodiments of the invention in which an exclusive property or right is claimed are defined as follows:

1. An infrared radiation detector comprising in combination:

a semiconductor body having a depression formed in a first surface of the body;

a thin film dielectric member attached to the first surface at least at one location and positioned to [suspend the dielectric member] *be suspended* as a thermally isolated structure over said depression; and[,]

a thin film layer of vanadium oxide *operated in its semiconductor phase and* embedded in said dielectric member over said depression, said thin film layer having a high temperature coefficient of resistance; and, contacts to said thin film layer of vanadium oxide adapted to be connected to a measuring circuit.

2. The detector according to claim 1 in which the thin film layer of vanadium oxide is of a thickness <1000 angstroms.

3. The detector according to claim 1 in which the thin film layer of vanadium oxide has a resistivity on the order of 1000 ohms per square.

4. The detector according to claim 1 in which the thin film dielectric is of silicon nitride.

5. The detector according to claim 1 in which the semiconductor body is of single crystalline silicon.

6. The infrared detector according to claim 1 further comprising: an antenna member coupled to the thin film layer of vanadium oxide.

7. The detector according to claim 6 wherein the antenna member comprises a metallic conductor shaped to optimize electromagnetic radiation of a predetermined wavelength.

8. The detector according to claim 7 wherein the antenna member comprises a dipole antenna disposed upon the thin film dielectric member.

9. The detector according to claim 8 further comprising an electrically conducting ground plane disposed on a second surface of the semiconductor body opposite the first surface of the semiconductor body.

10. The detector according to claim 9, wherein the ground plane is composed of copper.

11. The detector according to claim 10, wherein the ground plane is a thickness effective to reflect radiation incident on the first surface of the semiconductor body back through the semiconductor body and toward the antenna member.

12. The detector according to claim 11, wherein the copper ground plane is approximately 2000 Angstroms thick.

13. The detector of claim 8 wherein the antenna member comprises generally a bow-tie shape and wherein the bow-tie shaped antenna is electrically coupled to the thin film layer of vanadium oxide at the center, or "knot," of the bow-tie shaped antenna.

14. An infrared radiation detector comprising in combination:

a thin film resistor of vanadium oxide *operated in its semiconductor phase and* encapsulated in *a* thin film dielectric;

a semiconductor body having a depression therein;

the encapsulated thin film resistor of vanadium oxide and thin film dielectric forming a thin film member bridged across the depression so that at least a major portion of the thin film resistor is out of contact with the semiconductor body; and, contacts to said thin film resistor adapted to be connected to a measuring circuit.

15. The detector according to claim 14 in which the thin film layer of vanadium oxide is of a thickness <1000 angstroms.

16. The detector according to claim 14 in which the thin film layer of vanadium oxide has a resistivity on the order of 1000 ohms per square.

17. The detector according to claim 14 in which the thin film dielectric is of silicon nitride.

18. The detector according to claim 14 in which the semiconductor body is of single crystalline silicon.

19. An infrared radiation detector comprising in combination:

a single crystalline silicon substrate having a depression formed in a first surface of the substrate;

a thin film silicon nitride member attached to the first surface at least at one location and positioned to be suspended over said depression as a thermally isolated structure;

a thin film layer of vanadium oxide *operated in its semiconductor phase and* embedded in said silicon nitride member, said thin film layer having a high temperature coefficient of resistance; and[,]

contacts to said thin film layer of vanadium oxide adapted to be connected to a measuring circuit.

20. An infrared radiation detector comprising in combination:

a thin film resistor of vanadium oxide *operated in its semiconductor phase and* embedded in a thin film silicon nitride member;

a silicon substrate having a depression in the major surface thereof;

the thin film resistor and the thin film silicon nitride member forming a thin film member fastened to the surface and bridged across the depression so that at least a major portion of the thin film resistor is out of contact with the substrate; and, contacts on said thin film resistor adapted to be connected to a measuring circuit.

21. An infrared detector element comprising:

a cavity in a semiconductor structure across one surface of which is suspended a resistor of vanadium oxide *operated in its semiconductor phase and* being suspended and supported by a thin film of dielectric material, said suspension being disposed such that at least a major portion of said vanadium oxide resistor is out of substantial thermal contact with said semiconductor structure.

22. An infrared detector as set forth in claim 21 wherein said vanadium oxide resistor is a thin film resistor.

23. The infrared detector according to claim 21, further comprising an antenna member coupled to the thin film layer of vanadium oxide.

24. An infrared radiation detector element comprising a semiconductor structure having a cavity across which is suspended a highly sensitive detector material which has a thermal coefficient of resistance greater than metal, a film thickness of less than 1000 Å, and having film impedance in the range of 100 to 100,000 ohms, said detector material *being a metal oxide semiconductor operated in its semiconductor phase and* disposed upon a layer of a dielectric material which supports said highly sensitive detector material so that a major portion of said highly sensitive detector material is out of contact with said semiconductor structure.

*25. A high-sensitivity infrared radiation detector comprising in combination:*

*a semiconductor body;*

*a thin film dielectric member attached to said body at least at one location and positioned to be suspended as a thermally isolated structure over said body;*

*a thin film layer of an oxide of vanadium operated in its semiconductor phase and embedded in said dielectric member, said thin film layer having a high temperature coefficient of resistance; and*

*contacts to said thin film layer being adapted to be connected to a measuring circuit.*

*26. Apparatus of claim 25 wherein said thin film layer of an oxide of vanadium is of a thickness <1000 Angstroms.*

*27. Apparatus of claim 25 wherein said thin film dielectric member is of silicon nitride.*

*28. Apparatus of claim 25 wherein said semiconductor body is of single crystalline silicon.*

*29. A high sensitivity electromagnetic energy detector comprising in combination:*

*a supporting body;*

*a dielectric member attached to said body at least at one location and positioned to be suspended as a thermally isolated structure over said body;*

*a metal oxide semiconductor material supported by said dielectric member, said semiconductor material being operated in its semiconductor phase and having a high temperature coefficient of resistance; and*

*contacts to said semiconductor material adapted to be connected to a measuring circuit.*

*30. Apparatus of claim 29 further characterized by said supporting body being a semiconductor.*

*31. Apparatus of claim 29 further characterized by said dielectric member being a thin film.*

*32. Apparatus of claim 29 further characterized by said metal oxide semiconductor material comprising oxides of vanadium.*

*33. Apparatus of claim 32 further characterized by said metal oxide semiconductor material being a thin film.*

*34. Apparatus of claim 30 further characterized by said dielectric member and said metal oxide semiconductor material being thin films.*

*35. Apparatus of claim 34 further characterized by said metal oxide semiconductor material comprising oxides of vanadium.*

* * * * *